(12) United States Patent
Worsham et al.

(10) Patent No.: US 7,307,025 B1
(45) Date of Patent: Dec. 11, 2007

(54) LAG CONTROL

(75) Inventors: Binet A. Worsham, San Jose, CA (US); Sean S. Kang, San Ramon, CA (US); David Wei, Fremont, CA (US); Vinay Pohray, Fremont, CA (US); Bi Ming Yen, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 180 days.

(21) Appl. No.: 11/104,733

(22) Filed: Apr. 12, 2005

(51) Int. Cl.
*H01L 21/302* (2006.01)

(52) U.S. Cl. ............... 438/711; 438/713; 438/723; 438/733; 438/743

(58) Field of Classification Search ............... 438/711, 438/713, 733, 743, 723
See application file for complete search history.

(56) References Cited

U.S. PATENT DOCUMENTS

| | | | |
|---|---|---|---|
| 5,772,906 A * | 6/1998 | Abraham | ............... 216/72 |
| 6,380,087 B1 * | 4/2002 | Gupta et al. | ............... 438/692 |
| 6,486,070 B1 | 11/2002 | Ho et al. | |
| 6,760,529 B2 * | 7/2004 | Chong et al. | ............... 385/129 |
| 6,828,250 B1 | 12/2004 | Annapragada et al. | |
| 2003/0029834 A1 * | 2/2003 | Lill et al. | ............... 216/59 |

* cited by examiner

*Primary Examiner*—Binh X. Tran
(74) *Attorney, Agent, or Firm*—Beyer Weaver LLP

(57) ABSTRACT

A method for etching features in a silicon oxide based dielectric layer over a substrate, comprising performing an etch cycle. A lag etch partially etching features in the silicon oxide based dielectric layer is performed, comprising providing a lag etchant gas, forming a plasma from the lag etchant gas, and etching the etch layer with the lag etchant gas, so that smaller features are etched slower than wider features. A reverse lag etch further etching the features in the silicon oxide based dielectric layer is performed comprising providing a reverse lag etchant gas, which is different from the lag etchant gas and is more polymerizing than the lag etchant gas, forming a plasma from the reverse lag etchant gas, and etching the silicon oxide based dielectric layer with the plasma formed from the reverse lag etchant gas, so that smaller features are etched faster than wider features.

15 Claims, 9 Drawing Sheets

LAG CONTROL

BACKGROUND OF THE INVENTION

During semiconductor wafer processing, features of the semiconductor device are defined in the wafer using well-known patterning and etching processes. In these processes, a photoresist (PR) material may be deposited on the wafer and then is exposed to light filtered by a reticle. The reticle may be a transparent plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby produce the desired features in the wafer.

To provide increased density, feature size is reduced. This may be achieved by reducing the critical dimension (CD) of the features, which requires improved photoresist resolution.

Integrated circuits use dielectric layers, which have typically been formed from silicon dioxide, $SiO_2$, to insulate conductive lines on various layers of a semiconductor structure. As semiconductor circuits become faster and more compact, operating frequencies increase and the distances between the conductive lines within the semiconductor device decrease. This introduces an increased level of coupling capacitance to the circuit, which has the drawback of slowing the operation of the semiconductor device. Therefore, it has become important to use dielectric layers that are capable of effectively reducing the coupling capacitance levels in the circuit.

In general, the capacitance in an integrated circuit is directly proportional to the dielectric constant, k, of the material used to form the dielectric layers. As noted above, the dielectric layers in conventional integrated circuits have traditionally been formed of $SiO_2$, which has a dielectric constant of about 4.0. In an effort to reduce the coupling capacitance levels in integrated circuits, the semiconductor industry has engaged in research to develop materials having a dielectric constant lower than that of $SiO_2$, which materials are suitable for use in forming the dielectric layers in integrated circuits. To date, a number of promising materials, which are sometimes referred to as "low-k materials", have been developed. Many of these new dielectrics are organic compounds. In the specification and claims, the definition of a low-k material, is a material with a dielectric constant less than 3.

Low-k materials include, but are specifically not limited to: benzocyclobutene or BCB; Flare™ manufactured by Allied Signal® of Morristown, N.J., a division of Honeywell, Inc., Minneapolis, Minn.; one or more of the Parylene dimers available from Union Carbide® Corporation, Danbury Conn.; polytetrafluoroethylene or PTFE; and SiLK®. One PTFE suitable for IC dielectric application is SPEEDFILM™, available from W. L. Gore & Associates, Inc, Newark, Del. SiLK®, available from the Dow® Chemical Company, Midland, Mich., is a silicon-free BCB.

One common type of etching is reactive ion etching, or RIE. For RIE it is observed that the etch rate is dependant on feature size and density. In general, smaller openings are etched more slowly than those that are wider. Accordingly, large features etch at a faster rate than small features. This effect is known as Aspect Ratio Dependent Etch (ARDE) or "RIE lag". In addition, areas with a higher feature density etch at a faster rate than areas with a lower feature density. This is also known as "RIE" lag.

SUMMARY OF THE INVENTION

To achieve the foregoing and in accordance with the purpose of the present invention a method for etching features in a silicon oxide based dielectric layer over a substrate, comprising performing an etch cycle is provided. A lag etch partially etching features in the silicon oxide based dielectric layer is performed, which comprises providing a lag etchant gas, forming a plasma from the lag etchant gas, and etching the etch layer with the lag etchant gas, so that smaller features are etched slower than wider features. A reverse lag etch further etching the features in the silicon oxide based dielectric layer is performed comprising providing a reverse lag etchant gas, which is different from the lag etchant gas and is more polymerizing than the lag etchant gas, forming a plasma from the reverse lag etchant gas, and etching the silicon oxide based dielectric layer with the plasma formed from the reverse lag etchant gas, so that smaller features are etched faster than wider features.

In another manifestation of the invention an apparatus for forming a features in a dielectric layer, wherein the dielectric layer is supported by a substrate and wherein the etch layer is covered by a photoresist mask is provided. A plasma processing chamber comprises chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. A gas source is in fluid connection with the gas inlet and comprises a lag etchant gas source and a reverse lag etchant gas source. A controller is controllably connected to the gas source and the at least one electrode and comprises at least one processor and computer readable media. The computer readable media comprises computer readable code for performing an etch cycle. The computer readable code for performing the etch cycle comprises computer readable code for performing a lag etch partially etching features in the silicon oxide based dielectric layer and computer readable code for performing a reverse lag etch further etching the features in the silicon oxide based dielectric layer. The computer readable code for performing a lag etch comprises computer readable code for providing a lag etchant gas, computer readable code for forming a plasma from the lag etchant gas, and computer readable code for etching the etch layer with the lag etchant gas, so that smaller features are etched slower than wider features. The computer readable code for performing a reverse lag etch further etching the features in the silicon oxide based dielectric layer comprises computer readable code for providing a reverse lag etchant gas, which is different from the lag etchant gas and is more polymerizing than the lag etchant gas, computer readable code for forming a plasma from the reverse lag etchant gas, and computer readable code for etching the silicon oxide based dielectric layer with the plasma formed from the reverse lag etchant gas, so that smaller features are etched faster than wider features.

In another manifestation of the invention a method for etching features in a silicon oxide based dielectric layer over a substrate and below a mask, comprising performing an etch cycle for at least two cycles is provided. A lag etch partially etching features in the silicon oxide based dielectric layer is performed, comprising providing a lag etchant gas, wherein the lag etchant gas comprises a fluorine containing compound and $N_2$, wherein the lag etchant gas has a fluorine to carbon ratio of greater than 1:1, forming a plasma from the lag etchant gas, and etching the etch layer with the lag etchant gas, so that smaller features are etched slower than wider features. A reverse lag etch further etching the features in the silicon oxide based dielectric layer is performed, comprising providing a reverse lag etchant gas, which is different from the lag etchant gas, wherein the reverse lag etchant gas comprises at least one of a combination of hydrofluorocarbon and oxygen or a fluorocarbon and hydrogen and has a hydrogen to fluorine ratio greater than 2:1 and has a carbon to fluorine ratio of at least 1:1, wherein the reverse lag etchant gas is $N_2$ free, forming a plasma from the reverse lag etchant gas, and etching the silicon oxide based dielectric layer with the plasma formed from the reverse lag etchant gas, so that smaller features are etched faster than wider features.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
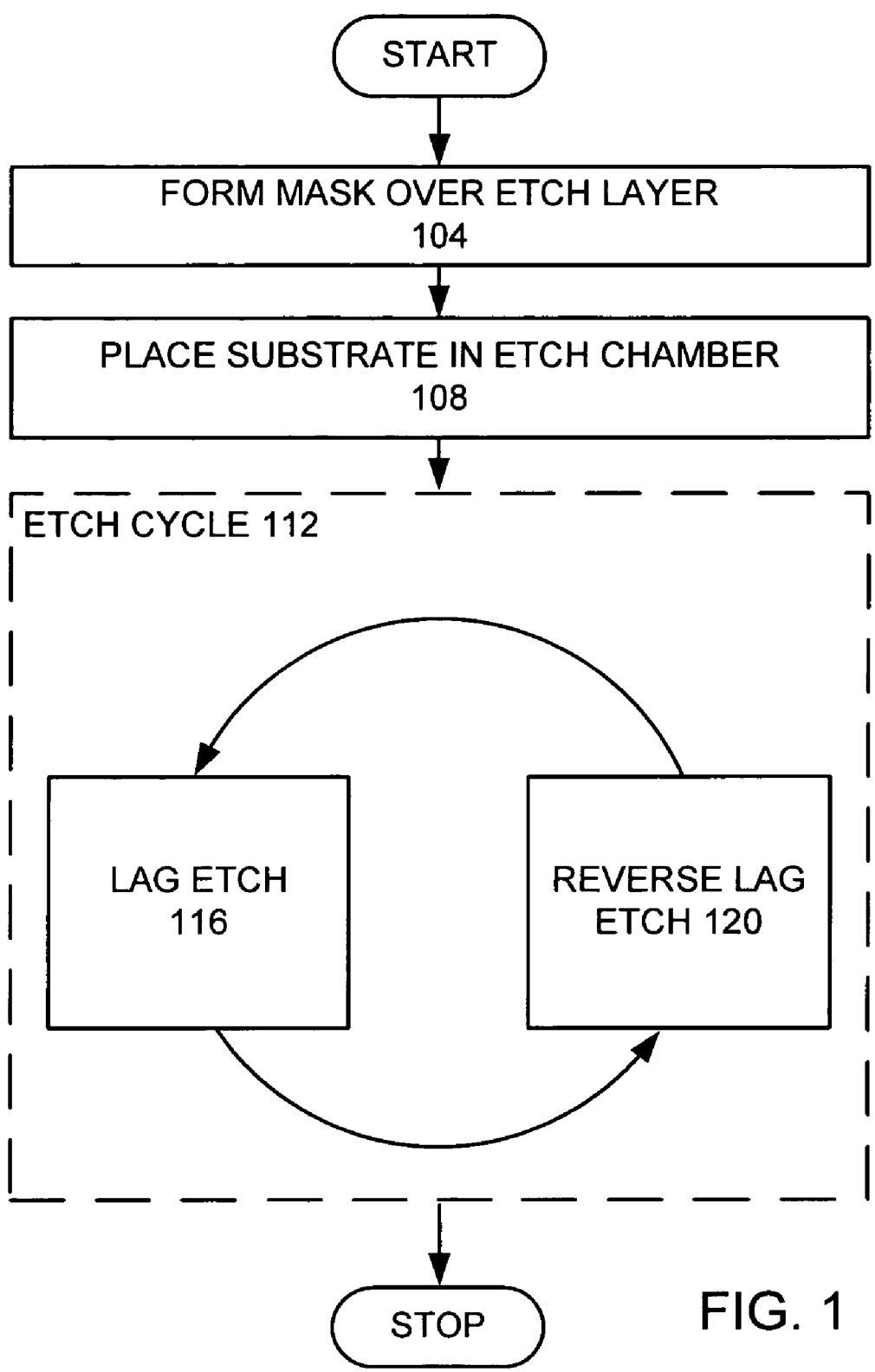
FIG. 1 is a high level flow chart of an embodiment of the invention.
Figure 5A:
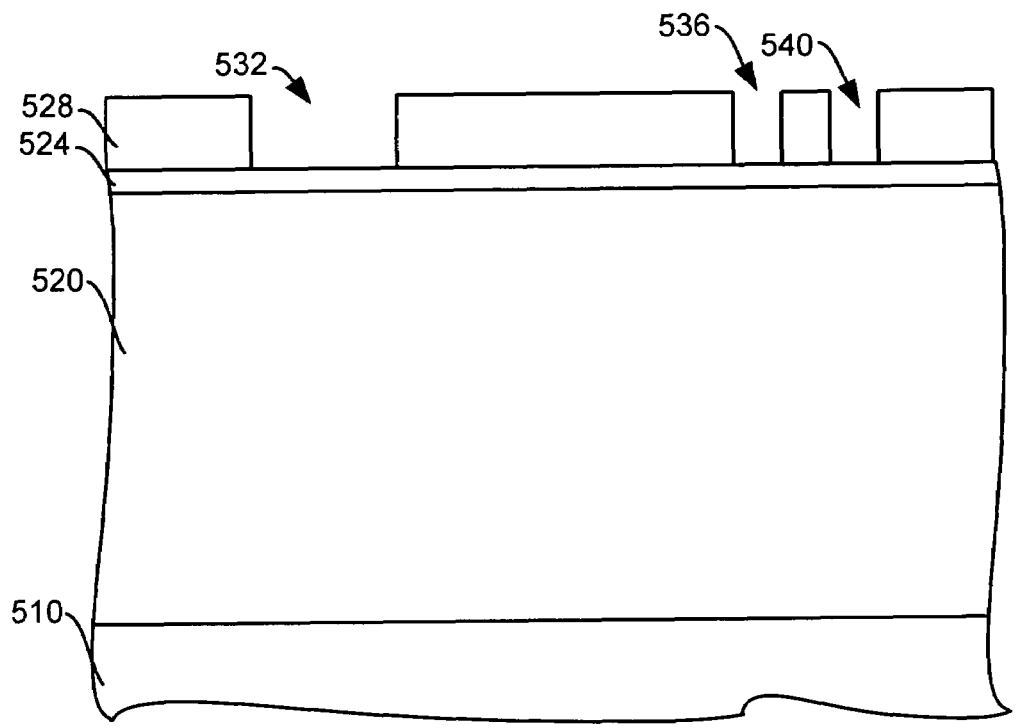
FIGS. 5A–F are schematic views of a layer etched by a multicycle etch.

To facilitate understanding, FIG. 1 is a high level flow chart of a process used in an embodiment of the invention. A mask 528 is formed over an etch layer 520, which is disposed over a substrate 510 (step 104), as shown in FIG. 5A, which is a schematic cross-sectional view. Although this example shows that the etch layer 520 is contiguous to the substrate 510, one or more layers may be between the etch layer 520 and the substrate 510. In this example, an antireflective coating ARC 524 is disposed between the mask 528 and the etch layer 520. In this example, the mask 528 defines a first opening 532, which as a wide opening and a second opening 536 and third opening 540, which are narrower openings and closely spaced together. In this example, the substrate 510 is a silicon wafer, the etch layer is a silicon oxide based dielectric, the ARC 524 is a bottom antireflective coating BARC material, and the photoresist is a 193 nm or greater photoresist. The substrate is placed in an etch chamber (step 108).

Figure 3:
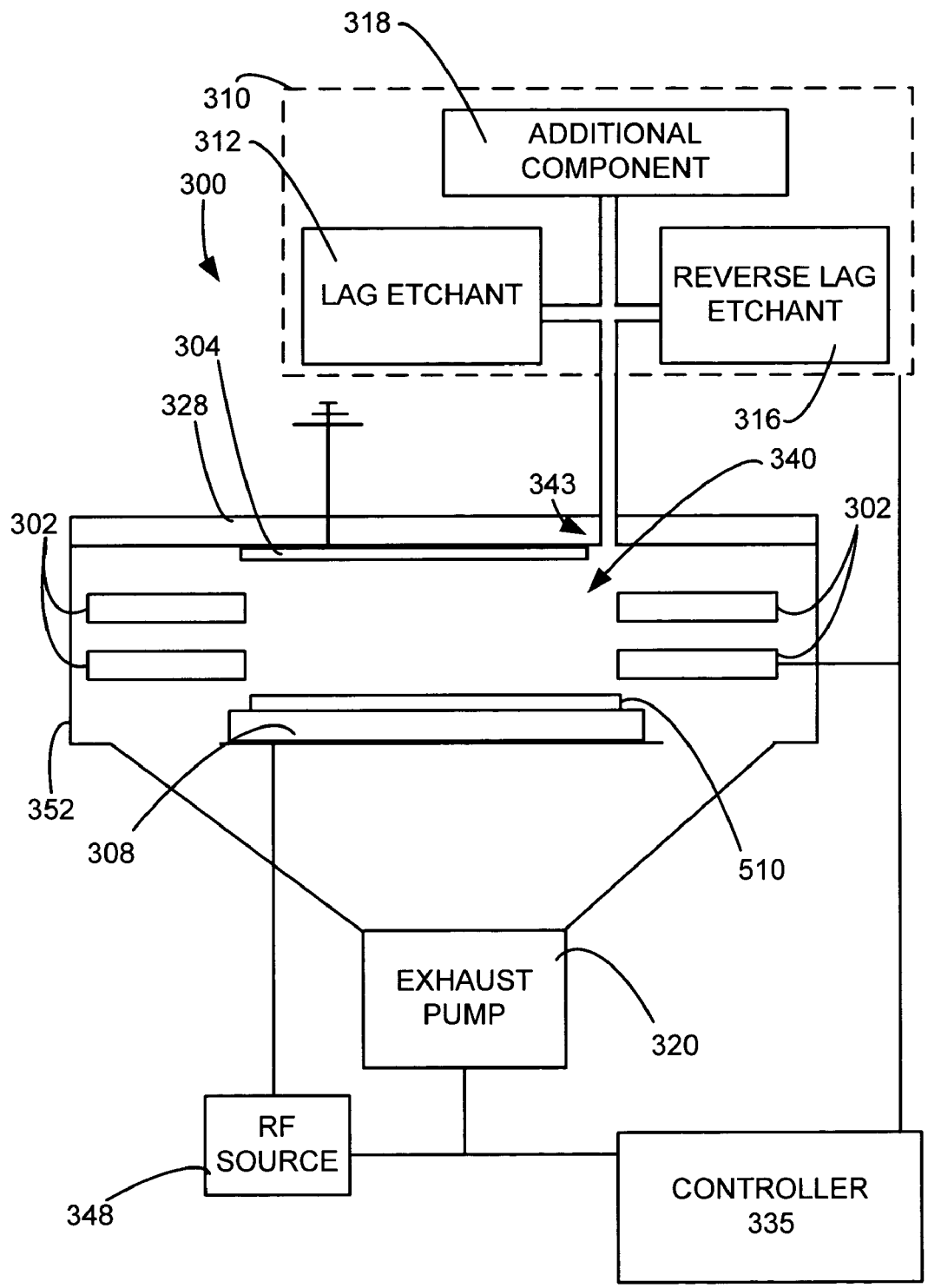
FIG. 3 is a schematic view of a plasma processing chamber that may be used for etching.

FIG. 3 is a schematic view of a plasma processing chamber 300 that may be used for inventive etching. The plasma processing chamber 300 comprises confinement rings 302, an upper electrode 304, a lower electrode 308, a gas source 310, and an exhaust pump 320. Within plasma processing chamber 300, the substrate 510 is positioned upon the lower electrode 308. The lower electrode 308 incorporates a suitable substrate chucking mechanism (e.g., electrostatic, mechanical clamping, or the like) for holding the substrate 510. The reactor top 328 incorporates the upper electrode 304 disposed immediately opposite the lower electrode 308. The upper electrode 304, lower electrode 308, and confinement rings 302 define the confined plasma volume. Gas is supplied to the confined plasma volume by the gas source 310 and is exhausted from the confined plasma volume through the confinement rings 302 and an exhaust port by the exhaust pump 320. In this embodiment, the gas source 310 comprises a lag etchant source 312 and a reverse lag etchant source 316. The gas source 310 may further comprise other gas sources, such as an additional component source 318. An RF source 348 is electrically connected to the lower electrode 308. Chamber walls 352 surround the confinement rings 302, the upper electrode 304, and the lower electrode 308. Different combinations of connecting RF power to the electrode are possible. In a preferred embodiment of the invention, the 27 MHz, and 2 MHz power sources make up the RF power source 348 connected to the lower electrode, and the upper electrode is grounded. A controller 335 is controllably connected to the RF source 348, exhaust pump 320, and the gas source 310.

Figure 4A:
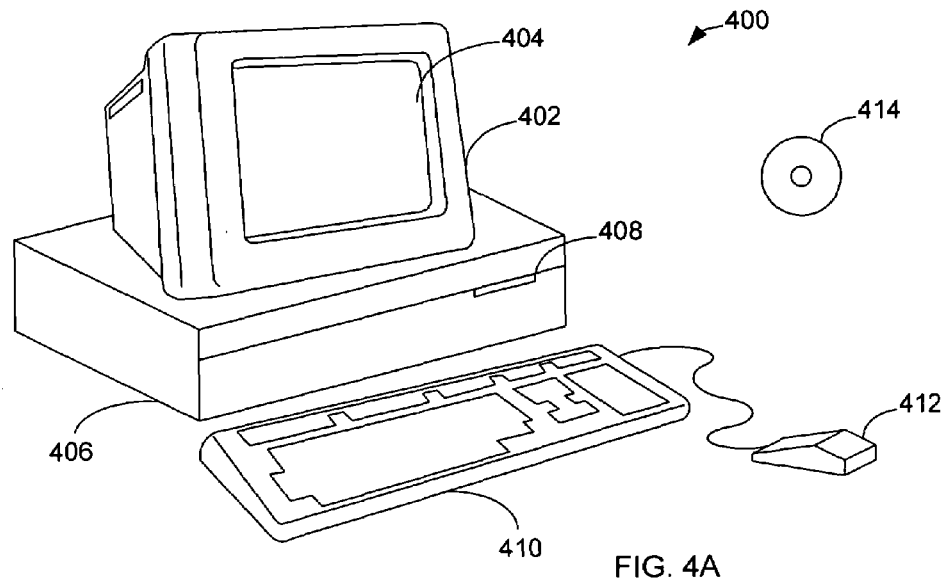
FIGS. 4A–B illustrate a computer system, which is suitable for implementing a controller used in embodiments of the present invention.
Figure 4B:
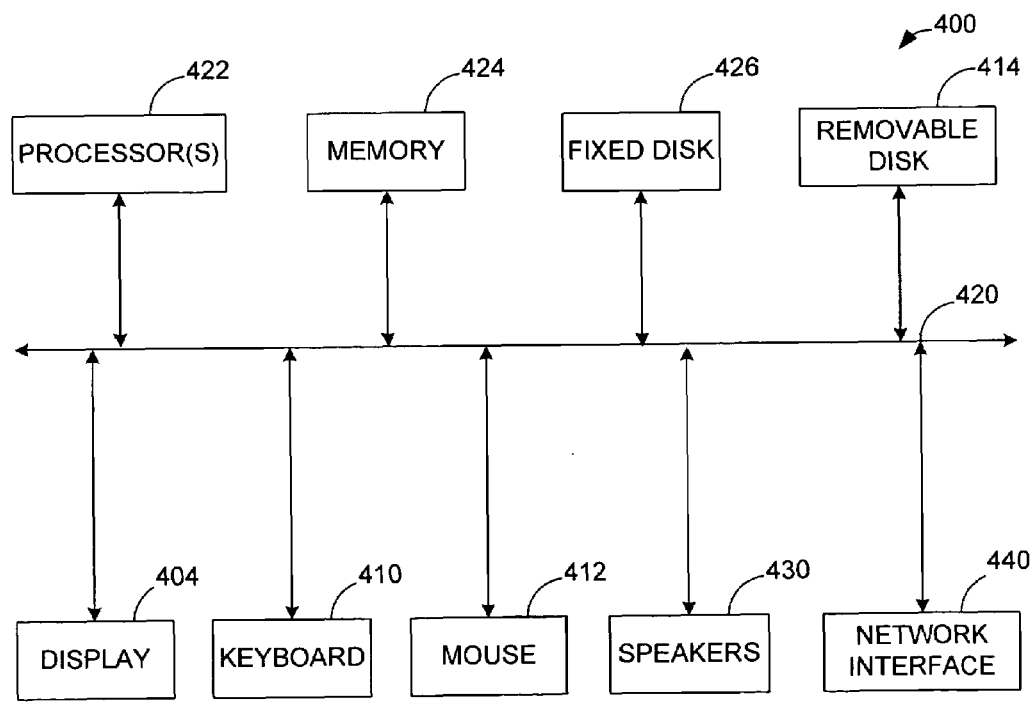

FIGS. 4A and 4B illustrate a computer system 400, which is suitable for implementing a controller 335 used in embodiments of the present invention. FIG. 4A shows one possible physical form of the computer system. Of course, the computer system may have many physical forms ranging from an integrated circuit, a printed circuit board, and a small handheld device up to a huge super computer. Computer system 400 includes a monitor 402, a display 404, a housing 406, a disk drive 408, a keyboard 410, and a mouse 412. Disk 414 is a computer-readable medium used to transfer data to and from computer system 400.

FIG. 4B is an example of a block diagram for computer system 400. Attached to system bus 420 is a wide variety of subsystems. Processor(s) 422 (also referred to as central processing units, or CPUs) are coupled to storage devices, including memory 424. Memory 424 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 426 is also coupled bi-directionally to CPU 422; it provides additional data storage capacity and may also include any of the computer-readable media described below. Fixed disk 426 may be used to store programs, data, and the like and is typically a secondary storage medium (such as a hard disk) that is slower than primary storage. It will be appreciated that the information retained within fixed disk 426 may, in appropriate cases, be incorporated in standard fashion as virtual memory in memory 424. Removable disk 414 may take the form of the computer-readable media described below.

CPU 422 is also coupled to a variety of input/output devices, such as display 404, keyboard 410, mouse 412, and speakers 430. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 422 optionally may be coupled to another computer or telecommunications network using network interface 440. With such a network interface, it is contemplated that the CPU might receive information from the network, or might output information to the network in the course of performing the above-described method steps. Furthermore, method embodiments of the present invention may execute solely upon CPU 422 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 2:
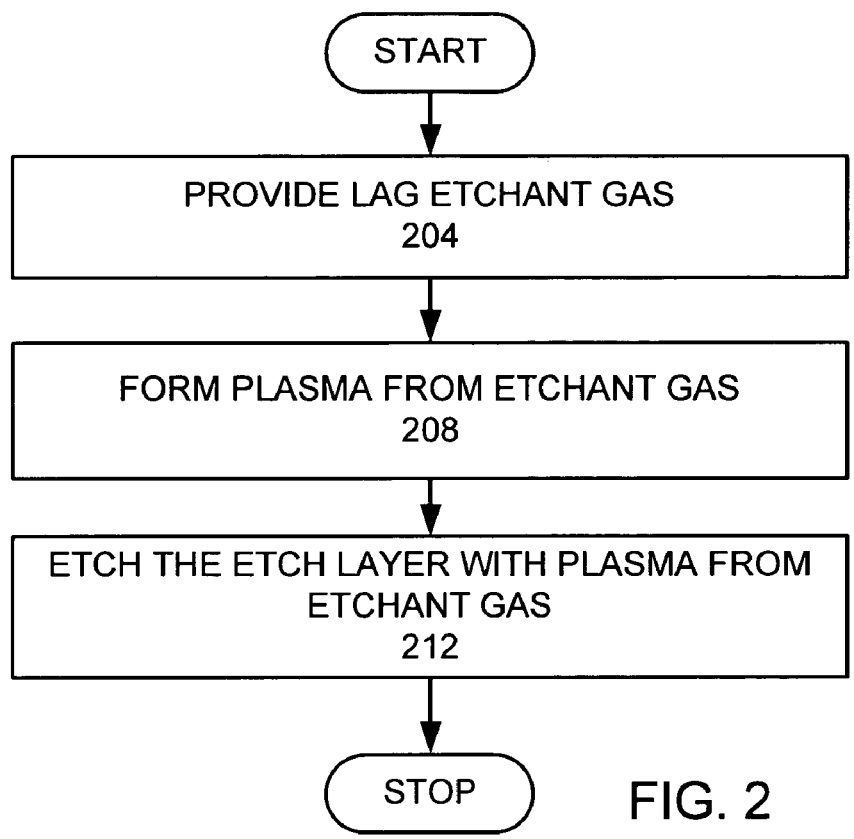
FIG. 2 is flow chart of a performance of a lag formation.
Figure 5B:
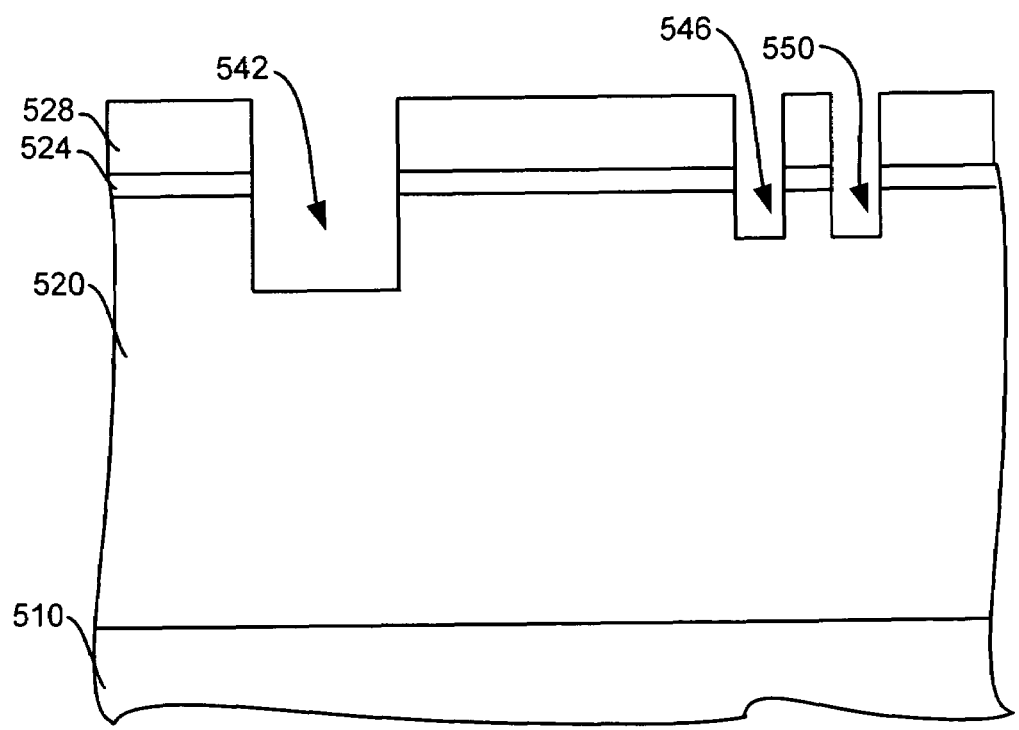

An etch cycle is performed in the etch chamber 300 for a multiple of cycles (step 112). In this embodiment a lag etch is first performed (step 116). FIG. 2 is a more detailed flow chart of the lag etch step (step 116). A lag etchant gas is provided to into the etch chamber 300 from the lag etchant source 312 (step 204). In this example, where the etch layer 520 is organosilicate glass (OSG), the lag etchant gas is 275 sccm Ar, 45 sccm $CF_4$, 10 sccm $C_4F_8$, 9 sccm $O_2$, and 40 sccm $N_2$. The lag etchant gas is converted to a plasma (step 208). In this example, the pressure in the plasma chamber is set at 1800 mTorr. The RF source provides 300 Watts at 27 MHz and 0 Watts at 2 MHz. The plasma from the etchant gas is used to partially etch first, second, and third features 542, 546, 550 into the etch layer 520, as shown in FIG. 5B (step 212). This phase of the cycle is carried out for 35 seconds Since the etch is a lag etch, the first feature 542 is etched faster than the second feature 546 and third feature 550, since the first feature 542 is wider and further spaced apart than the second feature 546 and third feature 550, as shown. This difference in etching between the features due to the lag etch forms a lag formation.

Figure 6:
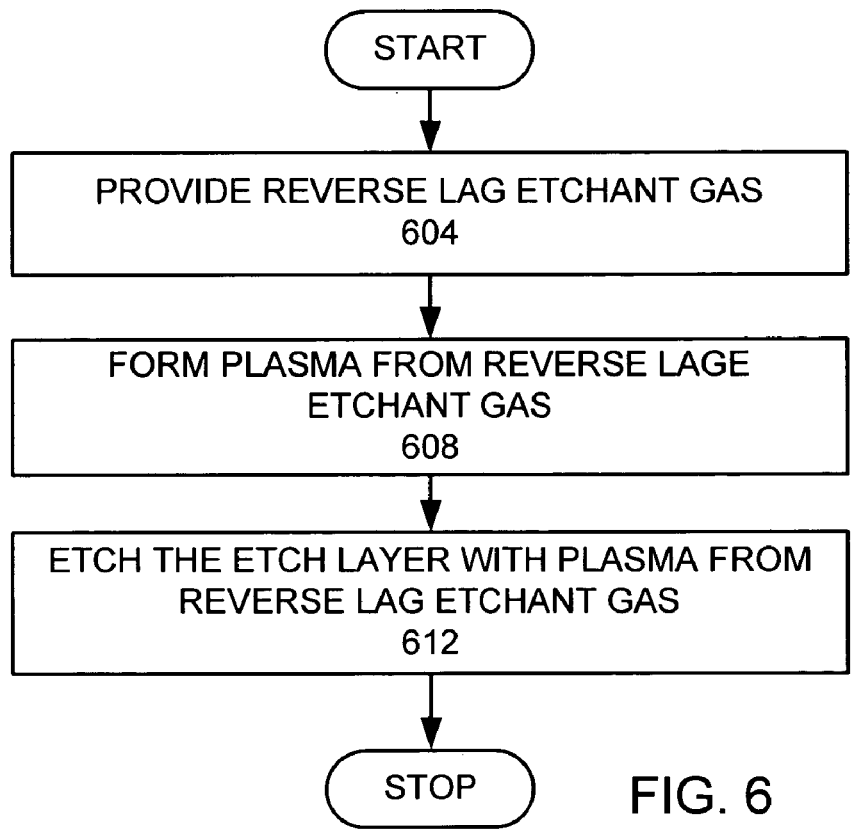
FIG. 6 is a flow chart of a reverse lag etch.
Figure 5C:
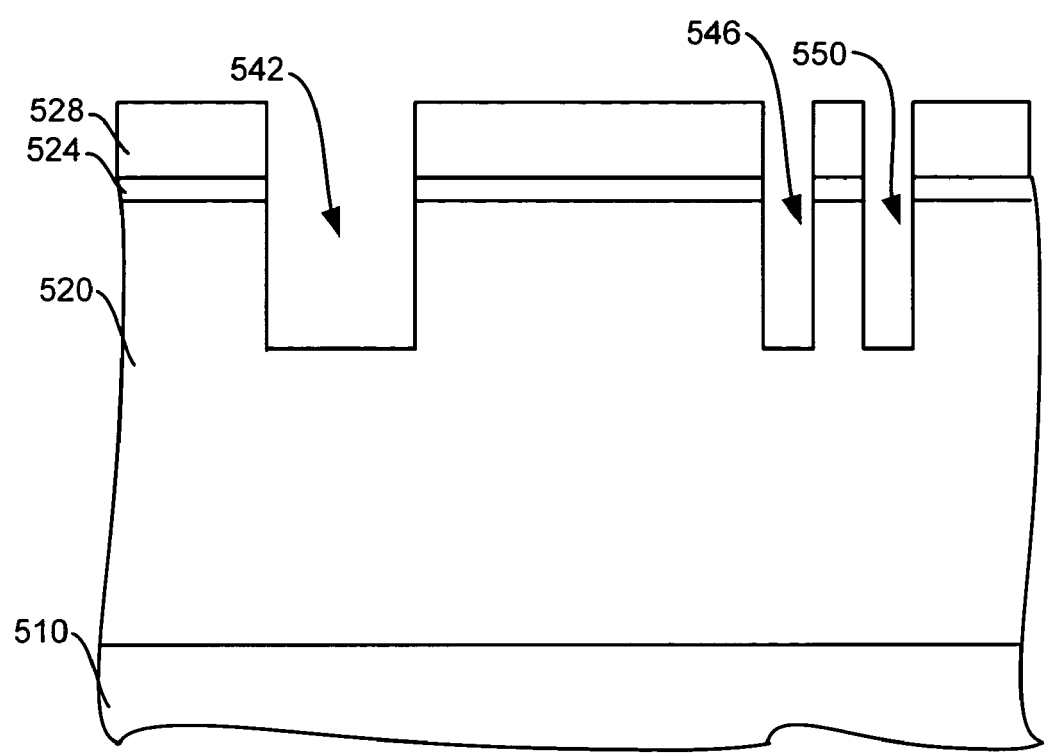

Next a reverse lag etch is performed (step 120). FIG. 6 is a more detailed flow chart of the reverse lag etch (step 120). A reverse lag etchant gas is provided to the etch chamber 300 from the reverse lag etchant source 316 (step 604). An example of a reverse lag etchant gas is 400 sccm Ar, 50 sccm $CH_3F$, and 3 sccm $O_2$. The reverse lag etchant gas is converted to a plasma (step 608). In this example, the pressure in the plasma chamber is set at 80 mTorr. The RF source provides 600 Watts at 27 MHz and 200 Watts at 2 MHz. The plasma from the etchant gas is used to further etch the first, second, and third features 542, 546, 550 into the etch layer 520, as shown in FIG. 5C (step 612). This phase of the cycle is carried out for 15 seconds. Since the etch is a reverse lag etch, the first feature 542 is etched slower than the second feature 546 and third feature 550, since the first feature 542 is wider and further spaced apart than the second feature 546 and third feature 550, as shown. In this example at the end of this step, the features are all etched to about the same depth. In other embodiments, the features etched faster by the reverse lag etch may be deeper than the features etched faster by the lag etch.

Without wishing to be bound by theory, it is believed that the reverse lag etchant gas of this invention forms more polymer over wider and less dense features, causing such features to etch more slowly than narrower and more dense features.

Figure 5D:
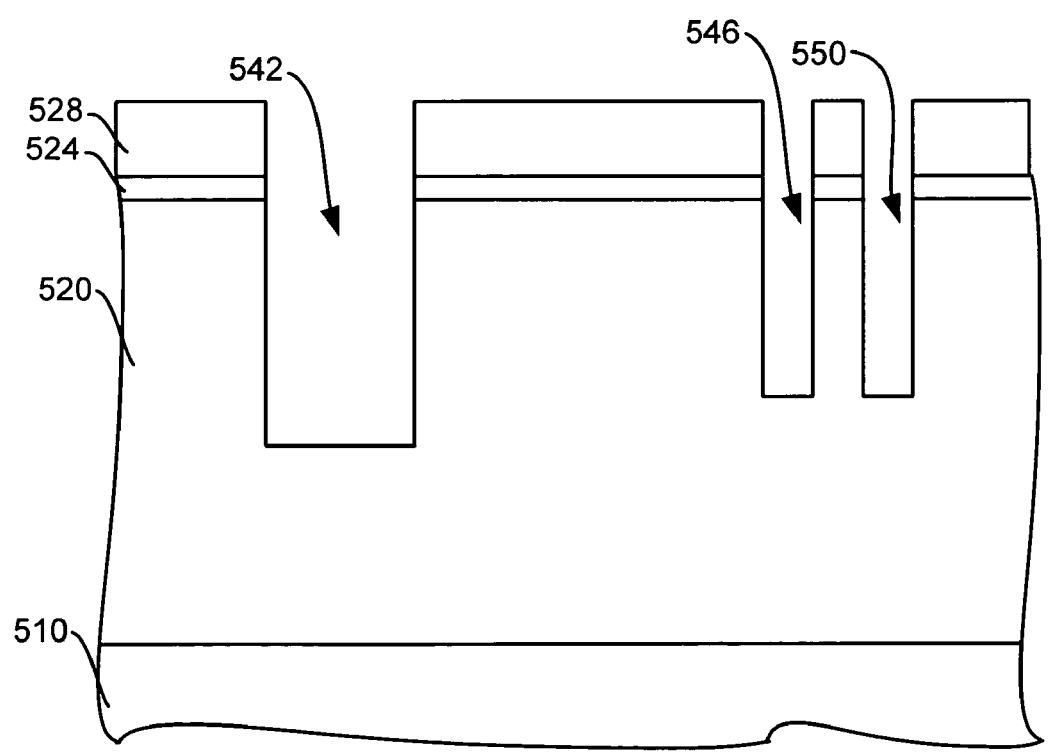
Figure 5E:
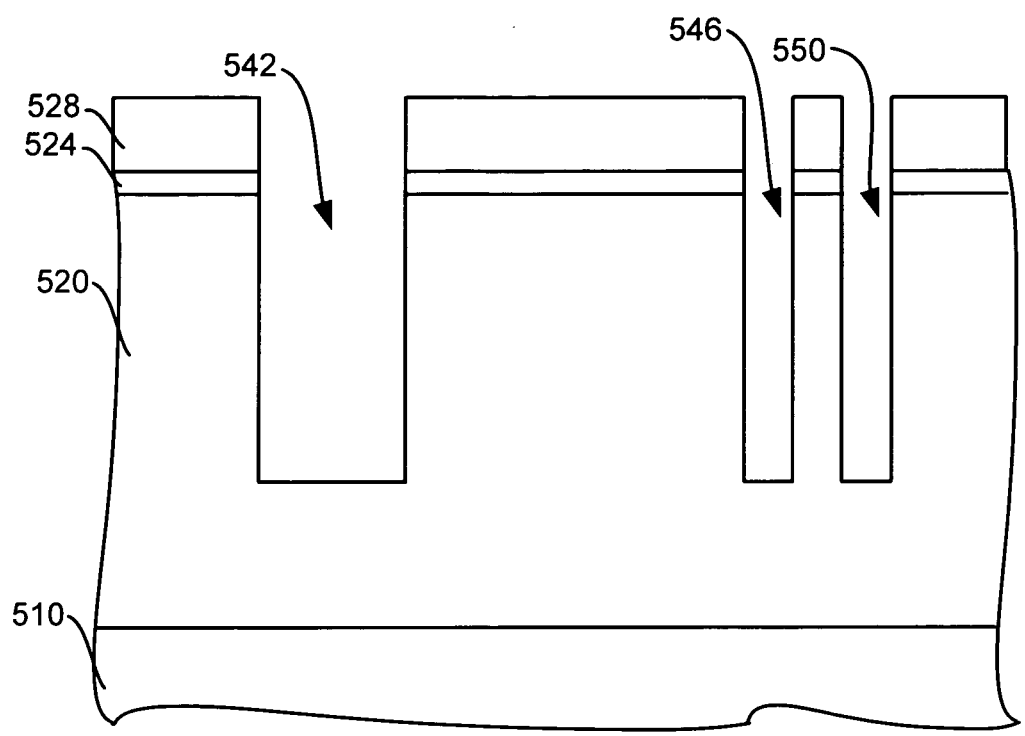

The etch cycle 112 is repeated a second time, first with the lag etch (step 116). The process of the lag formation illustrated in the flow chart of FIG. 2 is performed, resulting in the etch of the etch layer 520, as shown in FIG. 5D. Again, the first feature 542 is etched faster than the second and third features 546, 550. The reverse lag etch 120 is then repeated as shown in more detail in FIG. 6, resulting in the etch of the etch layer 520, as shown in FIG. 5E. Again, the first feature 542 is etched slower than the second and third features 546, 550.

Figure 5F:
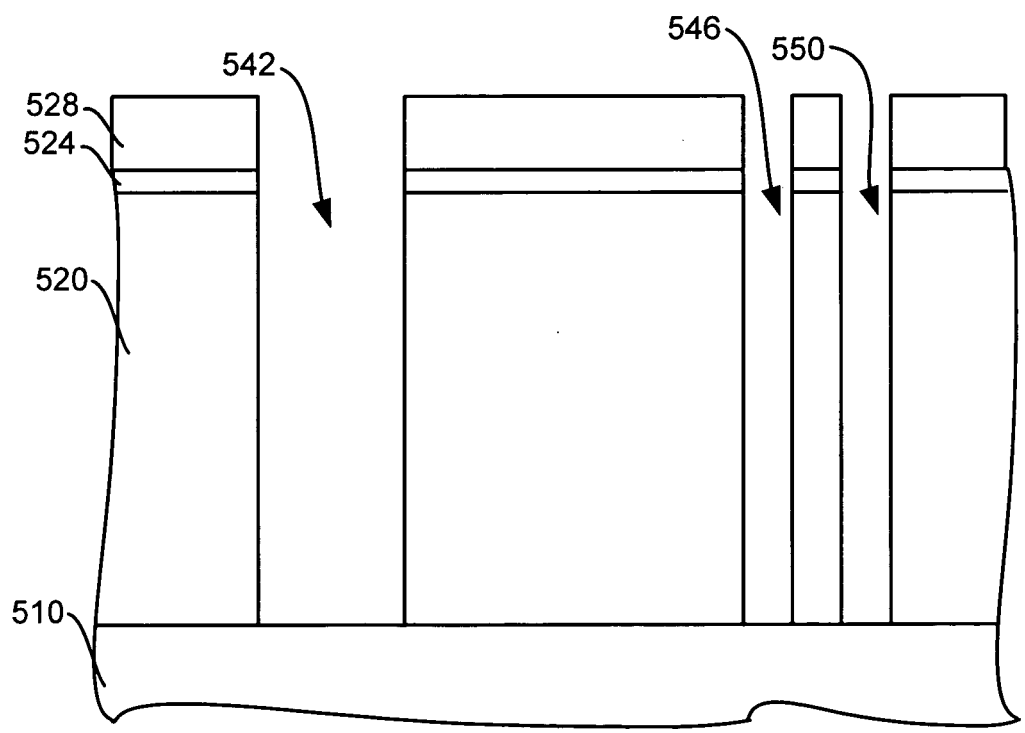

The etch cycle 112 may be repeated an additional number of times, until the etch is completed, as shown in FIG. 5F. The first, second, and third features 542, 546, 550 are completely etched with a net even etch rate. In this embodiment, the entire etch cycle 212 is performed in situ in the etch chamber, without removing the substrate from the etch chamber.

This embodiment of the invention provides several parameters that may be used to tune the etch process to prevent an uneven etch rate. Such parameters are different etchant gas chemistry combinations for each phase of the etch cycle, the ratio of time periods for the lag formation and the reverse lag etch, the total period for each cycle, and the number of cycles.

In the specification and claims a lag etch is defined as an etch in which smaller openings are etched more slowly than wider openings. A reverse lag etch is defined as an etch in which smaller openings are etched faster than wider openings.

Dual Damascene Application

Figure 7:
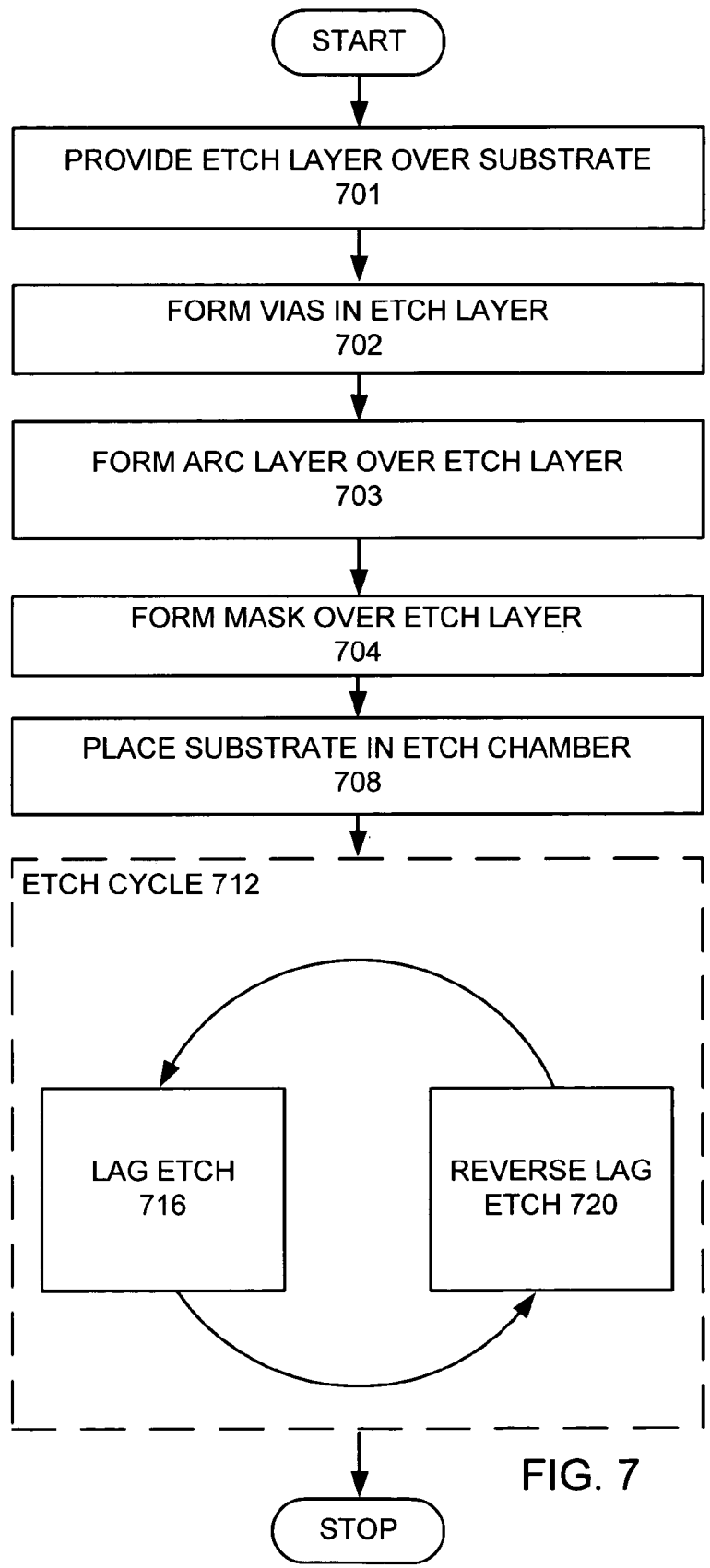
FIG. 7 is a flow chart of a dual damascene process.

One example of an application of the above embodiment is a dual damascene process. FIG. 7 is a flow chart of such a process. An etch layer 820 is deposited over a substrate 810

Figure 8A:
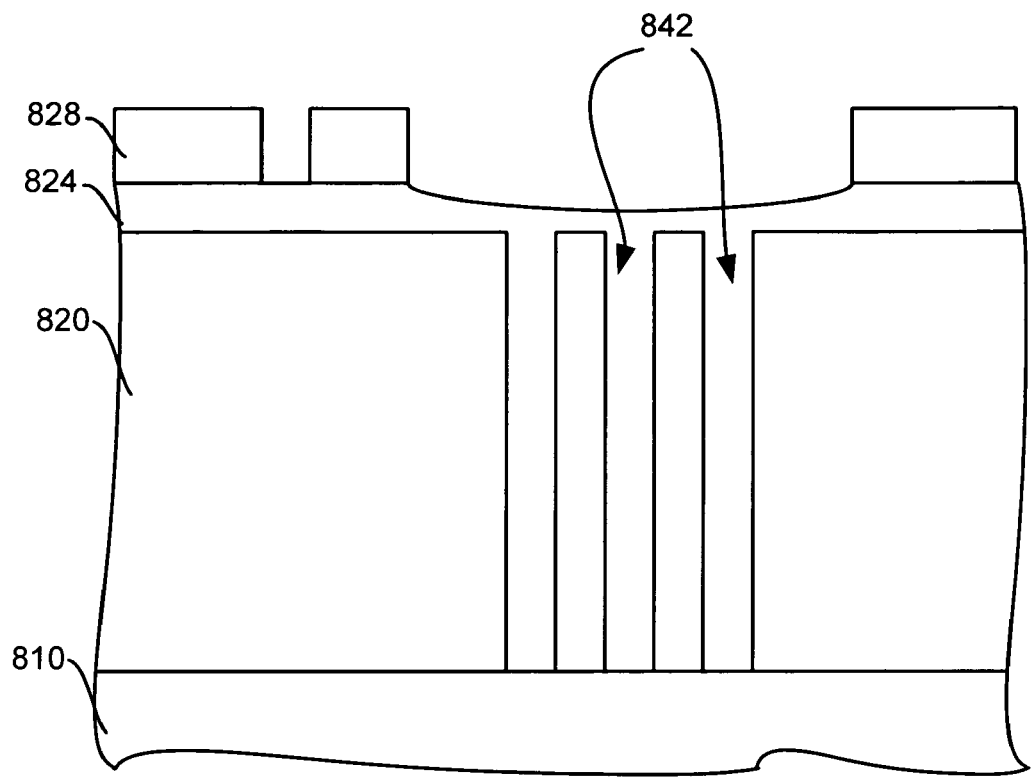
FIGS. 8A–B are schematic views of a layer etched by a dual damascene etch.

(step 701). In this example, the etch layer is a silicon oxide based dielectric, such as organosilicate glass (OSG). FIG. 8A is a cross-sectional view of an etch layer 820 over a substrate 810. Vias 842 are formed in the etch layer 820 (step 702). An ARC layer 824 is formed over the etch layer 820 (step 703). In this example, the ARC layer is spun on and helps to form via plugs in the vias. In this embodiment, an outer surface of the ARC layer 824 near the vias 842 is lower than the outer surface of the ARC layer 824 where no via is nearby, as shown in FIG. 8A. Therefore, the ARC layer has a non-uniform outer surface. A mask 828 is then formed over the ARC layer (step 704). In this example, the lag formation is the thinner ARC layer 824 near the region of the vias 842. The lower outer surface of the ARC layer, means that less etching is needed for the area near the vias. When subsequent etching is performed, the etching will be more advanced in the area near the vias, since less etching is needed. Therefore, a lag-like formation exists in the region near the vias.

Figure 8B:
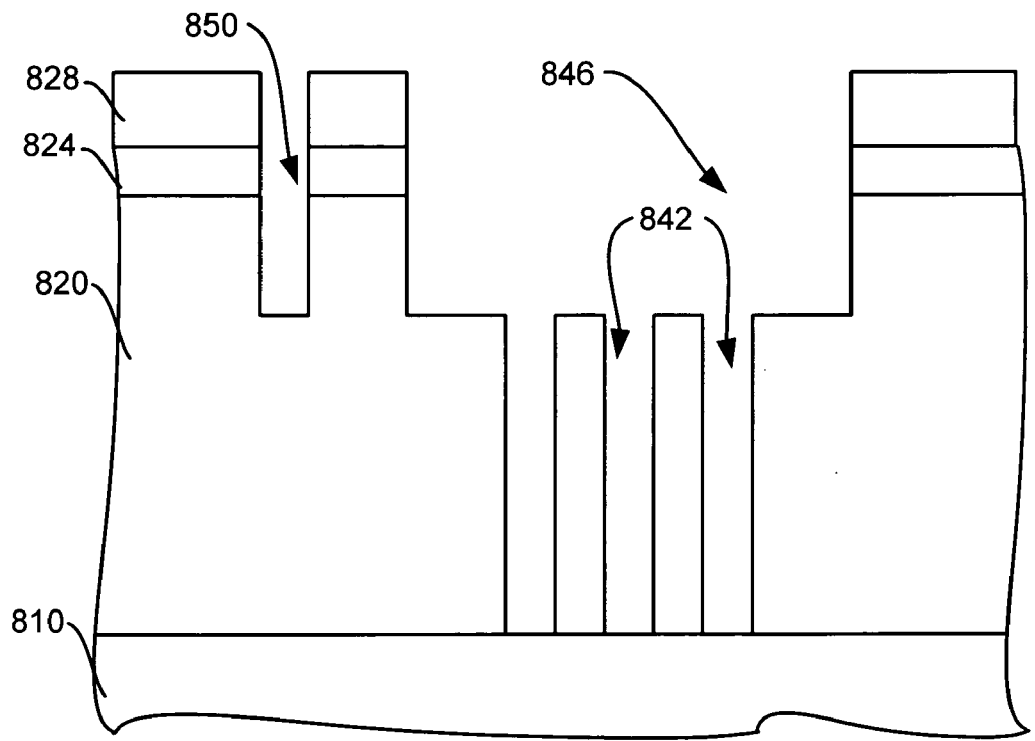

The substrate 810 is then placed in an etch chamber (step 708). An etch cycle is then performed (step 712). A lag etch may first be performed (step 716). A lag etch is then performed (step 720). The etch cycle 712 may use the same parameters as the etch cycle described above (step 112) for a plurality of cycles. FIG. 8B shows a first feature 846 and a second feature 850 etched into the etch layer 820 by a plurality of cycles during the etch cycle (step 712). In this example, the first feature 846 has about the same depth as the second feature 850, although in other embodiments, the feature depths may be different. The first feature 846 forms a trench around the vias 842. Although the ARC layer 824 was thinner above the first feature 846 and the first feature 846 is wider, so that it would normally have a faster etch rate, the use of a reverse lag helped to even the etch rates of the first feature 846 and the second feature 850.

Test Results

In a first test etch a single RIE lag etch was performed, with parameters to minimize faceting. An etchant gas of 275 sccm Ar, 45 sccm $CF_4$, 10 sccm $C_4F_8$, 9 sccm $O_2$, and 40 sccm $N_2$ was provided. The pressure in the plasma chamber is set at 120 mTorr. The RF source provides 300 Watts at 27 MHz and 100 Watts at 2 MHz. This step was maintained for about 65 seconds. This single RIE lag etch process was found to be good at reducing faceting but resulted in a lag range of about 50 nm.

In a second test etch an RIE lag etch was performed followed by a reverse RIE lag etch for one and a half cycles. For the lag etch, a lag etchant gas of 275 sccm Ar, 45 sccm $CF_4$, 10 sccm $C_4F_8$, 9 sccm $O_2$, and 40 sccm $N_2$ was provided. The pressure in the plasma chamber is set at 180 mTorr. The RF source provides 300 Watts at 27 MHz and 0 Watts at 2 MHz. This step was maintained for about 45 seconds. For the reverse lag etch, a reverse lag etchant gas of 400 sccm Ar, 50 sccm $CH_3F$, and 3 sccm $O_2$ was provided. The pressure in the plasma chamber is set at 80 mTorr. The RF source provides 600 Watts at 27 MHz and 200 Watts at 2 MHz. This step was maintained for about 27 seconds. In this test, a second RIE lag etch is again performed. This second RIE lag etch has the same parameters as the previous RIE lag etch, but is maintained for 50 seconds instead of 45 seconds. This one and a half cycle process was found to be good at reducing faceting and resulted in reducing lag to 40 nm.

In a third test etch a single RIE lag etch was performed followed by a single reverse RIE lag etch for two and a half cycles. For the first lag etch, a lag etchant gas of 275 sccm Ar, 45 sccm $CF_4$, 10 sccm $C_4F_8$, 9 sccm $O_2$, and 40 sccm $N_2$ was provided. The pressure in the plasma chamber is set at 180 mTorr. The RF source provides 300 Watts at 27 MHz and 0 Watts at 2 MHz. This step was maintained for about 35 seconds. For the first reverse lag etch, a reverse lag etchant gas of 400 sccm Ar, 50 sccm $CH_3F$, and 3 sccm $O_2$ was provided. The pressure in the plasma chamber is set at 80 mTorr. The RF source provides 600 Watts at 27 MHz and 200 Watts at 2 MHz. This step was maintained for about 15 seconds. A second RIE lag etch is again performed, using the same parameters as the first RIE lag etch. A second reverse RIE lag etch is again performed, using the same parameters as the first reverse RIE lag etch, except that this step is carried out for 12 seconds. A third RIE lag etch is again performed, using the same parameters as the first RIE lag etch, except that this step is only carried out for 12 seconds. This two and a half cycle process was found to be good at reducing faceting and resulted in reducing lag to −13 nm, which means that this process caused a reverse lag of 13 nm.

It can be seen from these tests that using at least two cycles helped to significantly reduce lag without increasing faceting. It is believed that such a process may also reduce striation and increase etch selectivity by providing photoresist protection.

Other embodiments may perform a reverse lag etch before the lag formation.

It is preferable that the etch layer is a dielectric layer. It is more preferable that the dielectric layer is a silicon oxide based dielectric layer. An example of an silicon oxide based dielectric with a low k (k<3.0) is organosilicate glass (OSG and also called SiCOH), such as, by way of example, but not limitation, CORAL™ from Novellus of San Jose, Calif.; Black Diamond™ from Applied Materials of Santa Clara, Calif.; Aurora™ available from ASM International N.V., The Netherlands; Sumika Film® available from Sumitomo Chemical America, Inc., Santa Clara, Calif., and HOSP™ from Allied Signal of Morristown, N.J. Organosilicate glass materials have carbon and hydrogen atoms incorporated into the silicon dioxide lattice which lowers the density, and hence the dielectric constant of the material. Some of these materials may be porous to further lower the k value.

Other types of dielectric materials that are not silicon oxide based may be organic materials such as polymers.

In addition, preferably, the RIE lag etchant gas is leaner than the reverse lag etchant gas. Some of the factors that make the RIE lag etchant gas leaner is that the RIE lag etchant gas has less hydrogen than the reverse RIE lag etchant gas. In this example, no hydrogen is provided in the RIE lag etchant gas, whereas three hydrogen atoms are provided in $CH_3F$. Therefore, in this example, the RIE lag etchant gas has a hydrogen to fluorine ration of 3:1 or greater than 2:1. In addition, the RIE lag etchant gas has more fluorine than the reverse lag etchant gas. In addition, the reverse RIE lag etchant gas has a higher ratio of carbon to fluorine than the RIE lag etchant gas. In the above example, the reverse RIE lag etchant gas has a carbon to fluorine ratio of at least 1:1. The RIE etchant gas has $CF_4$ provide a fluorine to carbon ratio of 4:1 and the $C_4F_8$ provide a fluorine to carbon ratio of 2:1, providing a net fluorine to carbon ration of between 2:1 and 4:1, which is greater than 1:1 or more preferably greater than 2:1. In addition, the RIE lag etchant gas in the above example has both $N_2$ and $O_2$ as additives, but has much more $N_2$ than $O_2$. The reverse RIE lag etchant gas in the above example has a small amount of $O_2$ additive and is $N_2$ free. The above comparisons between the RIE lag etchant gas and the reverse RIE lag etchant gas make the RIE lag etchant gas leaner than the reverse RIE lag etchant gas and cause the reverse RIE lag etchant gas to be more polymerizing than the RIE lag etchant gas. More polymerizing is defined as an etchant gas that forms more polymer during the etch.

In other embodiments, the reverse RIE lag etch may be provided before the RIE lag etch. In the claims, the order of the RIE lag etch and reverse RIE lag etch are not required to be in the order as listed, unless specifically stated.

Other embodiments may have more than five cycles to further reduce lag and faceting.

In other embodiment, the reverse lag etchant gas may be a fluorocarbon and hydrogen.

While this invention has been described in terms of several preferred embodiments, there are alterations, permutations. modifications, and various substitute equivalents, which fall within the scope of this invention. It should also be noted that there are many alternative ways of implementing the methods and apparatuses of the present invention. It is therefore intended that the following appended claims be interpreted as including all such alterations, permutations, and various substitute equivalents as fall within the true spirit and scope of the present invention.

What is claimed is:

1. A method for etching features in a silicon oxide based dielectric layer over a substrate, comprising performing an etch cycle, comprising:
   performing a lag etch partially etching features in the silicon oxide based dielectric layer, comprising:
      providing a lag etchant gas;
      forming a plasma from the lag etchant gas; and
      etching the silicon oxide based dielectric layer with the lag etchant gas, so that smaller features are etched slower than wider features; and
   performing a reverse lag etch further etching the features in the silicon oxide based dielectric layer, comprising:
      providing a reverse lag etchant gas, which is different from the lag etchant gas and is more polymerizing than the lag etchant gas;
      forming a plasma from the reverse lag etchant gas; and
      etching the silicon oxide based dielectric layer with the plasma formed from the reverse lag etchant gas, so that smaller features are etched faster than wider features.

2. The method, as recited in claim 1, wherein the cyclic process is performed for at least two cycles.

3. The method, as recited in claim 2, wherein the heavily polymerized etchant gas comprises at least one of a combination of hydrofluorocarbon and at least one of oxygen and nitrogen or a fluorocarbon and hydrogen.

4. The method, as recited in claim 2, wherein the lag etchant gas further comprises $N_2$.

5. The method, as recited in claim 4, wherein the reverse lag etchant gas is $N_2$ free and further comprises $O_2$.

6. The method, as recited in claim 2, wherein the reverse lag etchant gas comprises a containing fluorine compound and has a hydrogen to fluorine ratio greater than 2:1.

7. The method, as recited in claim 6, wherein the reverse lag etchant gas further has a carbon to fluorine ratio of at least 1:1.

8. The method, as recited in claim 7, wherein the reverse lag etchant gas comprises at least one of a combination of hydrofluorocarbon and at least one of oxygen and nitrogen or a fluorocarbon and hydrogen.

9. The method, as recited in claim 8, wherein the reverse lag etch is a reactive ion etch.

10. The method, as recited in claim 9, further comprising:
    forming a plurality of features in the silicon oxide based dielectric layer over the substrate;
    forming an ARC layer with a non-uniform outer surface over the silicon oxide based dielectric layer; and
    forming a mask layer over the ARC layer, prior to performing the etch cycle.

11. The method, as recited in claim 9, wherein the lag etchant gas comprises a fluorine containing compound and wherein the lag etchant gas has a fluorine to carbon ratio of greater than 2:1.

12. The method, as recited in claim 9, wherein the lag etchant gas comprises a fluorine containing compound and wherein the lag etchant gas has a fluorine to carbon ratio of greater than 1:1.

13. The method, as recited in claim 12, wherein the lag etchant gas further comprises $N_2$.

14. The method, as recited in claim 13, wherein the reverse lag etchant gas is $N_2$ free and further comprises $O_2$.

15. A method for etching features in a silicon oxide based dielectric layer over a substrate and below a mask, comprising performing an etch cycle for at least two cycles, comprising:
    performing a lag etch partially etching features in the silicon oxide based dielectric layer, comprising:
       providing a lag etchant gas, wherein the lag etchant gas comprises a fluorine containing compound and $N_2$, wherein the lag etchant gas has a fluorine to carbon ratio of greater than 1:1;
       forming a plasma from the lag etchant gas; and
       etching the silicon oxide based dielectric layer with the lag etchant gas, so that smaller features are etched slower than wider features; and
    performing a reverse lag etch further etching the features in the silicon oxide based dielectric layer, comprising:
       providing a reverse lag etchant gas, which is different from the lag etchant gas, wherein the reverse lag etchant gas comprises at least one of a combination of hydrofluorocarbon and oxygen or a fluorocarbon and hydrogen and has a hydrogen to fluorine ratio greater than 2:1 and has a carbon to fluorine ratio of at least 1:1, wherein the reverse lag etchant gas is $N_2$ free;
       forming a plasma from the reverse lag etchant gas; and
       etching the silicon oxide based dielectric layer with the plasma formed from the reverse lag etchant gas, so that smaller features are etched faster than wider features.

* * * * *